(12) United States Patent
Bustos et al.

(10) Patent No.: US 7,736,840 B2
(45) Date of Patent: Jun. 15, 2010

(54) PRODUCTION OF TWO SUPERPOSED ELEMENTS WITHIN AN INTEGRATED ELECTRONIC CIRCUIT

(75) Inventors: Jessy Bustos, Le Touvet (FR); Philippe Thony, Saint Joseph de Riviére (FR); Philippe Coronel, Barraux (FR)

(73) Assignees: STMicroelectronics (Crolles 2) SAS, Crolles (FR); Commissariat a l'Energie Atomique, Paris (FR)

( * ) Notice: Subject to any disclaimer, the term of this patent is extended or adjusted under 35 U.S.C. 154(b) by 1040 days.

(21) Appl. No.: 11/442,703

(22) Filed: May 26, 2006

(65) Prior Publication Data

US 2006/0281031 A1    Dec. 14, 2006

(30) Foreign Application Priority Data

Jun. 9, 2005    (FR) .................................. 05 05880

(51) Int. Cl.
H01L 21/00 (2006.01)
G03F 7/00 (2006.01)

(52) U.S. Cl. .................. 430/311; 430/313; 430/314; 430/320

(58) Field of Classification Search ................ 430/311, 430/313, 314, 320
See application file for complete search history.

(56) References Cited

U.S. PATENT DOCUMENTS

| | | | |
|---|---|---|---|
| 5,981,150 A | 11/1999 | Aoki et al. | |
| 6,080,654 A | 6/2000 | Manchester | |
| 6,756,286 B1 | 6/2004 | Moriceau et al. | |
| 2003/0042627 A1 | 3/2003 | Farrar et al. | |
| 2004/0104448 A1 | 6/2004 | Marty et al. | |
| 2005/0176222 A1 | 8/2005 | Ogura | |
| 2005/0208696 A1 | 9/2005 | Villa et al. | |
| 2005/0287767 A1 | 12/2005 | Dantz et al. | |

FOREIGN PATENT DOCUMENTS

EP    0 967 641 A2    12/1999

OTHER PUBLICATIONS

Patent Abstracts of Japan, vol. 1998, No. 6, Apr. 30, 1998 & JP 10 041207 A (Toshiba Corp), Feb. 13, 1998.

Tsutomu Sato, et al., "A New Substrate Engineering for the Formation of Empty Space in Silicon (ESS) Induced by Silicon Surface Migration;" IEEE No. 0-7803-5413-3, 1999.

Akito Hara, et al., "Self-Aligned Top and Bottom Metal Double Gate Low Temperature Poly-Si TFT Fabricated at 550°C. on Non-Alkali Glass Substrate by Using DPSS Cw Laser Lateral Crystallization Method," IEEE No. 0-7803-7873-3, 2003.

(Continued)

Primary Examiner—Thorl Chea
(74) Attorney, Agent, or Firm—Gardere Wynne Sewell LLP (57) ABSTRACT

A first circuit element, which is reflective, is formed. A first layer, which is attenuating, is formed. above the first circuit element. A second layer, which is transparent, is formed above the first layer to fill an aperture in the first layer. An overlying lithography resist layer is then exposed to a radiation flux level below a development threshold but high enough that a sum of the radiation flux level and a reflected secondary radiation flux level exceeds the development threshold. The lithography resist layer is developed so as to obtain a mask having an opening through which the first and second layers are removed to form a second aperture which is filled to form a second circuit element.

19 Claims, 6 Drawing Sheets

OTHER PUBLICATIONS

Preliminary French Search Report, FR 05 05880, dated Feb. 17, 2006.

Sato, et al., "A New Substrate Engineering for the Formation of Empty Space in Silicon (ESS) Induced by Silicon Surface Migration," Electron Devices Meeting, 1999; IEDM Technical Digest, International Washington, DC, USA, Dec. 5-8, 1999; Piscataway, NJ, USA, IEEE, US, Dec. 5, 1999, pp. 517-520; XP010372210; ISBN: 0-7803-5410-9.

Sato, et al., "SON (Silicon on Nothing) MOSFET using Ess (Empty Space in Silicon) Technique for SoC Applications," International Electron Devices Meeting 2001; IEDM; Technical Digest, Washington, DC, Dec. 2-5, 2001, New York, NY; IEEE, US Dec. 2, 2001, pp. 37.1.1-37.1.4; XP010575245; ISBN 0-7803-7050-3.

PRODUCTION OF TWO SUPERPOSED ELEMENTS WITHIN AN INTEGRATED ELECTRONIC CIRCUIT

PRIORITY CLAIM

The present application claims priority from French Patent Application No. 05 05880 filed Jun. 9, 2005, the disclosure of which is hereby incorporated by reference.

BACKGROUND OF THE INVENTION

1. Technical Field of the Invention

The present invention relates to a method for producing two superposed elements within an integrated electronic circuit. It also relates to an integrated electronic circuit that comprises elements produced in this way. In particular, the invention can be applied to the production of an electrical connection within an integrated electronic circuit.

2. Description of Related Art

An integrated electronic circuit usually possesses electrical connections that are arranged within several connection levels superposed on top of the surface of a substrate of the circuit. The first connection level, starting from the surface of the substrate, is called a premetallization layer. The following levels correspond to respective metallization layers. An electrical connection may connect elements of the circuit parallel to the surface of the substrate. It is then called a track. An electrical connection may also connect two elements of the circuit in the direction perpendicular to the surface of the substrate. In particular, it may thus connect a contact terminal of an electronic component produced on the surface of the substrate, such as a transistor or a diode, to a track located in the first metallization layer. The connection is then made through the premetallization layer. An electrical connection may also connect two superposed tracks within successive connection levels of the circuit. In the jargon of those skilled in the art, this connection is then called a "via".

Each connection level may be produced using the damascene process, or its variant "dual-damascene", both these being well known to those skilled in the art.

Each connection level is usually defined by one or two lithography steps. Each lithography step employs a mask that defines the locations and the dimensions of the tracks and/or of the connections or vias placed in this level. To produce a connection between two circuit elements placed in different levels, the lithography masks used for each of the levels must be precisely aligned with respect to the circuit substrate, so as to obtain electrical contacts of low electrical resistance at the lower and upper ends of the connection. However, an offset may unintentionally arise during these alignment operations, and this has to be taken into account in order to obtain satisfactory electrical contacts even when one of the lithography masks is offset with respect to the substrate.

Any offset of the lithography masks is taken into account by providing margins around the connection regions between elements of the circuit that are superposed in different levels. In other words, when designing the circuit, an enclosure is provided around each connection region between superposed elements so that a satisfactory electrical contact is obtained even if one of the two elements or the connection itself is offset with respect to the substrate. Circuit design rules set the margins that have to be provided around the connection regions.

Now, such margins occupy areas of the surface of the circuit, parallel to the surface of the substrate, and they consequently limit the level of integration of the circuit.

To reduce or eliminate certain margins in transistor gate levels, integrated electronic circuits have been produced in laboratory on glass substrates (2003 IEEE Proceedings, Akito Hara et al., p. 211). The transparency of the substrate to the radiation used during a lithography step allows two gates to be obtained that are aligned with each other along the direction perpendicular to the substrate. To do this, a resist mask formed on the circuit is exposed to UV light radiation through the substrate so that a lower gate already formed on the circuit constitutes an opaque screen that determines the dimensions of an upper gate located on the opposite side of the lower gate from the substrate. After the resist has been developed, the mask has at least one edge superposed with one side of the lower gate. This mask edge then defines one side of the upper gate. No margin therefore exists between the respective sides of the lower and upper gates, as alignment of one with respect to the other results from the screen effect used when exposing the circuit to the radiation of the lithography process. However, to do this it is necessary to use a substrate that is transparent to the radiation of the lithography process, something that is not the case for a silicon substrate.

There is a need in the art to reduce the margins needed around the elements of an integrated electronic circuit that have to be superposed one with respect to another, while still allowing a silicon substrate to be used for the circuit.

SUMMARY OF THE INVENTION

In accordance with an embodiment of the invention, a method of producing two superposed elements within an integrated electronic circuit is proposed, the circuit being formed by successive levels starting from a surface of a substrate, which method comprises the following steps:

a) forming at least a first circuit element in a first circuit level, this first element being reflective for the radiation of a lithography process;

b) forming a first layer above the first circuit level, in a first region of the circuit that contains a first part of the first circuit element and outside a second region of the circuit that contains a second part of the same first circuit element, the first layer being suitable for attenuating the radiation reflected by the first circuit element;

c) forming a second layer that is substantially transparent to said radiation so as to cover over the circuit at least in the second region;

d) depositing a lithography resist mask on the circuit, in the first and second regions;

e) exposing the resist mask to a primary radiation flux corresponding to an amount of radiation below the development threshold of the resist mask and defined so that the amount of radiation corresponding to the sum of the primary flux and of a secondary flux, obtained by reflection of this primary flux on the second part of the first circuit element, is above the development threshold of the resist mask;

f) developing the resist mask so as to remove the portions of resist that have been exposed to the amount of radiation above the development threshold;

g) etching the first and second layers through at least one aperture of the developed resist mask; and h) depositing a portion of a defined material in order to form a second circuit element in a third region of the circuit containing at least the second part of the first circuit element.

Furthermore, the second circuit element has at least one first side defined by an edge of said first layer, and at least one second side superimposed with a side of said first circuit element.

Thus, according to the invention, there are two contributions to the exposure of the resist mask to the radiation used for the lithography, namely, on the one hand, the primary flux produced by a source of the radiation external to the circuit and directed onto the upper surface of the circuit and, on the other hand, a secondary flux produced by the reflection of the primary flux on the first circuit element, through the first layer and, possibly, through the second layer. Given that the first layer has an antireflection function for the radiation used, the secondary flux exists essentially only in the second region of the circuit having no first layer, above the second part of the first circuit element. For this reason, the first layer may be called a BARC (bottom antireflection coating). The amount of radiation used for the lithography is adjusted so that the development threshold of the resist is exceeded in the second region of the circuit above the first circuit element, and is not reached in the first region of the circuit. The resist chosen is a negative resist, so that the development results in a removal of the resist portions that were exposed to the quantity of radiation above the development threshold. The resist mask therefore has an aperture above the second part of the first circuit element. The second circuit element, which is bounded parallel to the surface of the substrate in accordance with the aperture in the resist mask, is then exactly superposed with the second part of the first circuit element. In other words, the two circuit elements have at least one pair of respective sides that are aligned along the direction perpendicular to the surface of the substrate. In particular, the second element has at least one dimension, measured parallel to the substrate surface, which is equal to the corresponding dimension of the second part of the first circuit element.

No margin is therefore present between respective sides of the two circuit elements. This is because such margins would be unnecessary since the method automatically results in alignment of the second element with respect to the second part of the first element. This frees up more of the surface of the substrate, making it possible to obtain a higher level of integration of the circuit.

The invention therefore obviates the need for a lithography mask defining the position of the second circuit element to be aligned precisely with respect to the substrate of the circuit in at least one direction parallel to the surface of the substrate. This may result in a reduction in the circuit fabrication time, this being greater the higher the level of integration of the circuit, since the alignment precision that would be needed without the invention is greater.

The invention is therefore an improvement of the known lithography process used to produce integrated electronic circuits. It reduces or obviates the need to provide alignment margins. In addition, it may possibly allow the lithography process to be carried out more rapidly.

The second part of the first circuit element may contain a segment of that element, one length of which, parallel to the surface of the substrate, is defined by two opposed edges of the first layer. Alternatively, the second part of the first circuit element may contain one end of that element along a direction parallel to the surface of the substrate. In that case, one length of that end is defined by one edge of the first layer.

Optionally, the second region of the circuit may contain several parts of first circuit elements that are formed in the first circuit level and are reflective for the radiation of the lithography process. As many parts of second circuit elements are then simultaneously produced during one and the same execution of the method of the invention, which parts of second circuit elements are respectively superposed on the parts of the first circuit elements.

According to one particular way of implementing the invention, a layer that absorbs the radiation of the lithography process is deposited in the first circuit level around the first circuit element(s) or between the surface of the substrate and the first circuit level. The method of the invention is then compatible with the use of a substrate that reflects the radiation of the lithography process.

The invention may be applied in particular to the production of an electrical connection in an integrated electronic circuit. In this case, the first circuit element is electrically conducting, the second layer is electrically insulating, the first and second layers are etched in step g) until the second part of the first circuit element is exposed, and the material of the second circuit element is electrically conducting so as to form an electrical connection that connects the first circuit element.

The first circuit element may especially be a conducting track arranged in a connection level of the circuit. This connection level then corresponds to a metallization level and the second circuit element may be a via.

Alternatively, the first circuit element may be a contact terminal of an electronic component produced on the surface of the substrate. The electrical connection then extends through the premetallization level of the circuit perpendicular to the surface of the substrate.

Furthermore, the portion of conducting material deposited in step h) may comprise a first part extending from the first circuit element along a direction perpendicular to the substrate surface, and a second part forming a conducting track placed in a second circuit level. A single step of depositing conducting material therefore makes it possible to simultaneously make an electrical connection connecting the first circuit element in the direction perpendicular to the substrate surface, and a track in the second circuit level.

The invention also proposes an integrated electronic circuit comprising two superposed circuit elements produced using a method as defined above. Such circuit elements have respective sides that are aligned along the direction perpendicular to the substrate surface.

In accordance with an embodiment, a method comprises forming a first circuit element, said first circuit element being reflective with respect to lithography radiation. Next, a first layer is formed above the first circuit element, said first layer being attenuating with respect to lithography radiation and including a first aperture exposing at least a portion of the first circuit element. A second layer is then formed above the first layer and filling the aperture, said second layer being transparent with respect to lithography radiation. A lithography resist layer is then deposited above the second layer. The lithography resist layer is exposed to a radiation flux level below a development threshold of the lithography resist layer but high enough that a sum of the radiation flux level and a secondary radiation flux level reflected from the first circuit element exceeds the development threshold of the lithography resist layer. The lithography resist layer is developed so as to obtain a mask having an opening corresponding solely to exposed portion of the first circuit element which reflected lithography radiation. The first and second layers are then removed through the opening to form a second aperture which is filled to form a second circuit element having a first edge aligned with an edge of the first aperture and having a second edge aligned with an edge of first circuit element.

In accordance with another embodiment, a method comprises forming a lithography radiation attenuating layer above a first circuit element which is reflective of lithography radiation, defining a first aperture in the lithography radiation attenuating layer which exposes at least a portion of the first circuit element, forming a lithography radiation transparent layer above the first layer which fills the first aperture, depositing a lithography resist layer above the lithography radiation transparent layer, exposing the lithography resist layer to a radiation flux level below a development threshold of the lithography resist layer but high enough that a sum of the radiation flux level and a secondary radiation flux level reflected from the first circuit element exceeds the development threshold of the lithography resist layer, and developing the lithography resist layer so as to obtain a mask having an opening corresponding solely to the exposed portion of the first circuit element which reflected lithography radiation.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

For the sake of clarity, the dimensions of the circuit elements shown in these figures have not been drawn to scale. N denotes a direction perpendicular to the surfaces of substantially planar substrates used to produce the circuits described. The direction N is directed towards the top of the figures, which correspond to sectional views of the circuit, and the words "on", "under", "lower" and "upper" used in the rest of the description refer to this orientation. D1 and D2 are directions parallel to the surface of the substrates, namely the longitudinal direction and the transverse direction respectively.

FIGS. 1a, 2a, 3a, 4a and 6a are views of the circuit in a plane of section indicated by arrows in FIGS. 1b, 2b, 3b, 4b and 6b.

Moreover, identical references in different figures denote identical elements, or those that have identical functions.

Finally, a succession of elementary steps for producing integrated electronic circuits, which allows the invention to be reproduced, are described below. Each elementary step, which is considered as being known per se, has not been discussed in detail. The invention is illustrated in the context of the production of electrical connections, but of course it applies to the production of any circuit elements, whether electrically conducting or insulating, which have to be superposed one with respect to another.

Figure 1A:
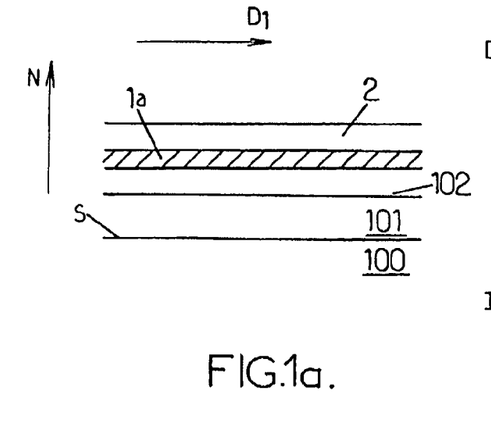
FIGS. 1a, 2a, 3a, 4a, 5a and 6a are sectional views of an integrated electronic circuit illustrating successive steps of a method according to a first way of implementing the invention.
Figure 1B:
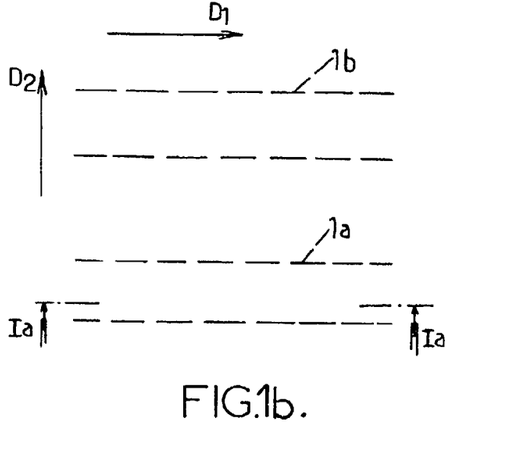
FIGS. 1b, 2b, 3b, 4b and 6b are top views of the circuit corresponding to FIGS. 1a, 2a, 3a, 4a and 6a, respectively.

As shown in FIGS. 1a and 1b, a substrate 100 of an integrated electronic circuit in the course of fabrication is covered on its upper surface S with a premetallization layer 101 and with at least one metallization layer 102 (FIG. 1a). The layers 101 and 102 may for example be based on silica ($SiO_2$). Two metal tracks 1a and 1b have been formed in the layer 102, for example using the damascene process. The tracks 1a and 1b are therefore made of copper (Cu). Alternatively, the tracks 1a and 1b may be made of aluminum (Al), titanium nitride (TiN) or any other conducting metal or alloy having a sufficient electrical conductivity. The layer 102 and the tracks 1a and 1b constitute the first metallization level of the circuit. FIG. 1b shows the two tracks 1a and 1b, which for example lie parallel to the direction D1. It should be understood that any other arrangement of the tracks 1a and 1b within the first metallization level of the circuit allows the invention to be implemented in a manner similar to that which will be now described in detail.

When the substrate 100 is reflective for the radiation of the lithography process intended to be used for implementing the invention, and in particular when the substrate 100 is made of silicon, at least one of the two layers 101 and 102 is selected so as to absorb this radiation. In this case, the material of one of the layers 101 or 102 includes at least one absorbent compound in a sufficient concentration for the radiation reflection produced by the substrate 100 to be sufficiently attenuated.

A layer 2 intended to attenuate the reflection of radiation directed against the upper surface of the circuit is then deposited on the layer 102. The function of the layer 2 will be described in detail later. To do this, the material of the layer 2 absorbs the radiation, or has refraction properties such that the layer 2 placed between the tracks 1a, 1b and an upper part of the circuit attenuates reflection of the radiation on the tracks 1a and 1b. As is known, such refraction properties are characterized by the refractive index of the material of the layer 2. The layer 2 may for example consist of a mixture of silica and another radiation-absorbing chemical compound. Alternatively, the other chemical compound may give the material of the layer 2 a higher refractive index than that of pure silica. Preferably, the material of the layer 2 is electrically insulating.

Figure 2A:
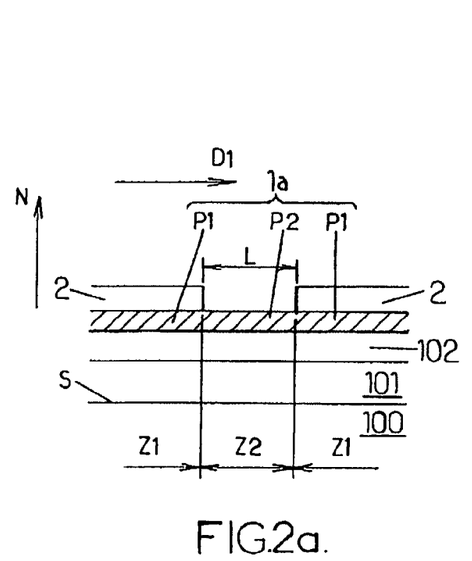
Figure 2B:
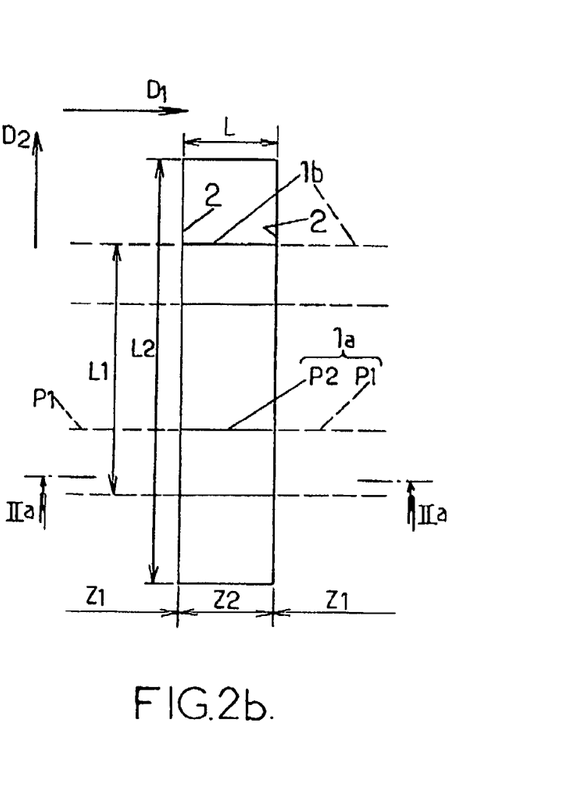

Next, the layer 2 is etched in a region Z2 of the circuit. The layer 2 is thus removed from the region Z2, and portions of the layer 2 are left in one or more regions Z1 of the circuit (FIGS. 2a and 2b). The regions Z1 and Z2 of the circuit contain, respectively, parts P1 and P2 of the track 1a and similar parts of the track 1b. For the sake of brevity, the method of forming an electrical connection according to the invention is described below for the track 1a, but it will be understood that another electrical connection is formed at the same time for the track 1b. FIGS. 1b, 2b, 3b, 4b and 6b illustrate the formation of two electrical connections placed on top of the two tracks 1a and 1b, respectively. As shown in FIG. 2b, the regions Z1 and Z2 may be complementary with respect to the surface S, and the length L2 of the region Z2 parallel to the direction D2 is greater than the width of each track 1a, 1b. In the example in question, the length L2 is greater than the distance L1 between the respective outer edges of the tracks 1a and 1b. In this way, it is unnecessary for the boundaries of the region Z2 along the direction D2 to be precisely located with respect to the tracks 1a and 1b, provided that these boundaries of the region Z2 are not offset until one of the outer edges of the tracks 1a and 1b is reached. In other words, if the region Z2, from which the layer 2 is removed, is defined by a lithography mask, this mask may be aligned quite rapidly since an offset of the region Z2 parallel to the direction D2 is compatible with the method of the invention.

L denotes the distance between two opposed edges of the layer 2 on either side of the region Z2 along the direction D1.

Figure 3A:
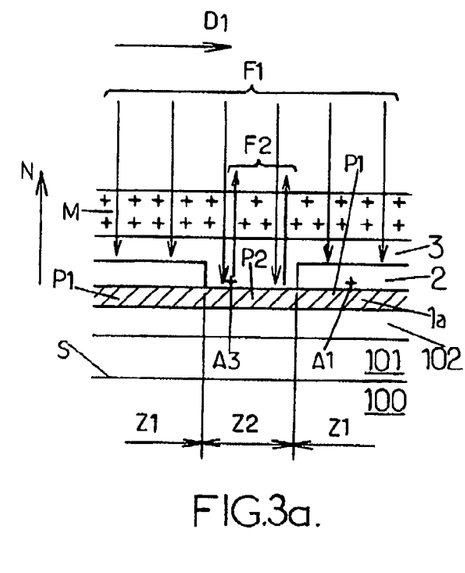

A layer 3 of insulating material is then deposited on the circuit so as to cover the circuit and fill the cavity formed by the removal of the layer 2 in the region Z2. The layer 3 is then polished in such a way that its upper face is substantially planar and parallel to the surface of the substrate S (FIG. 3a). This layer 3 may for example be made of silica or of any other material that is essentially transparent to the radiation whose reflection on the tracks 1*a* and 1*b* is attenuated by the layer 2.

A lithography resist layer M is deposited on the circuit, on top of the layer 3, with a thickness in the direction N suitable for the layer M subsequently to form an etching mask.

Next, the resist layer M is irradiated, by directing a beam of radiation F1 (FIG. 3*a*) against the upper surface of the circuit, parallel to the direction N but in the opposite sense thereto. The beam F1 is called the primary radiation flux. Preferably, the radiation used is UV light having a wavelength tailored to the type of resist of the layer M. The flux F1 passes through the layer M and the layer 3, since the latter is essentially transparent.

In the region Z1 of the circuit, the primary flux F1 passes through the layers M and 3, then reaches the layer 2 and, possibly, the track 1*a* at the points in the region Z1 that are located on the track part P1. At a point A1 (FIGS. 3*a* and 3*b*) in the region Z1, which is located on the track part P1, no flux reflected by this track part towards the upper surface of the circuit passes again through the resist layer M, since the layer 2 attenuates, or even eliminates, such reflection of the radiation. Simultaneously, part of the flux F1 that reaches a point A2 in the region Z1 lying outside the track part P1 does not engender reflected flux, which emerges from the layer 102, given that at least one of the layers 101 and 102 is absorbent if the substrate 100 is reflective. In all cases, any portion of the resist layer M located within the region Z1 of the circuit receives only a amount of radiation corresponding to the primary flux F1. This amount is adjusted so as to be below the development threshold of the resist mask M by the choice of the intensity of the flux F1 and/or the exposure time.

Figure 3B:
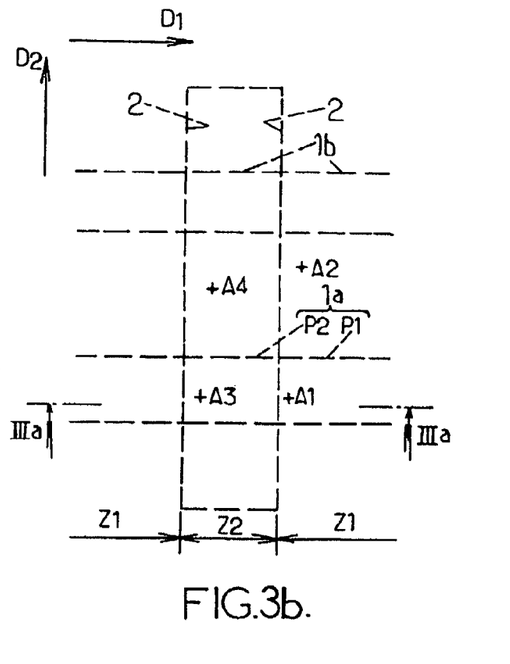

In the region Z2 of the circuit, no portion of the layer 2 covers the track part P2. Part of the primary flux F1 that reaches the track part P2 at a point A3 lying above the track part P2 is therefore reflected towards the upper surface of the circuit. The radiation flux produced by this reflection is called the secondary flux F2. The secondary flux F2 then passes back through the resist layer M. Part of the flux F1 that reaches a point A4 in the region Z2 lying outside the track part P2 is not reflected, either by a track or by the substrate 100 through the layers 101 and 102. The edges of the track 1*a* that are located in the region Z2 therefore define a transverse boundary, in the direction D2, of exposure of the mask M to the secondary flux F2.

Consequently, only the portions of the resist layer M which lie above track parts 1*a*, 1*b* in the region Z2 are penetrated both by the primary flux F1 and by the secondary flux F2. The intensity of the primary flux F1 and/or its duration are adjusted so that the amount of radiation that corresponds to the sum of the fluxes F1 and F2 is above the development threshold of the resist layer M.

Figure 4A:
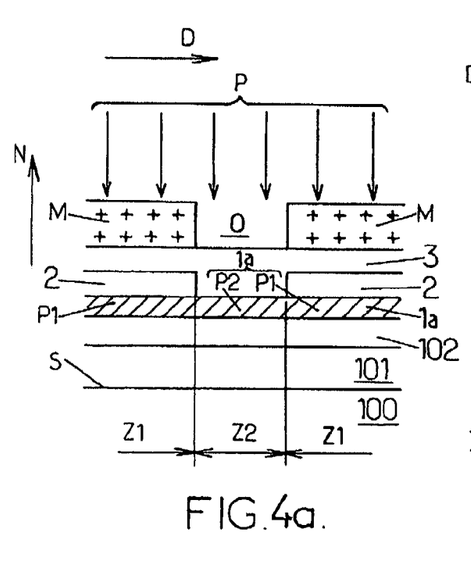
Figure 4B:
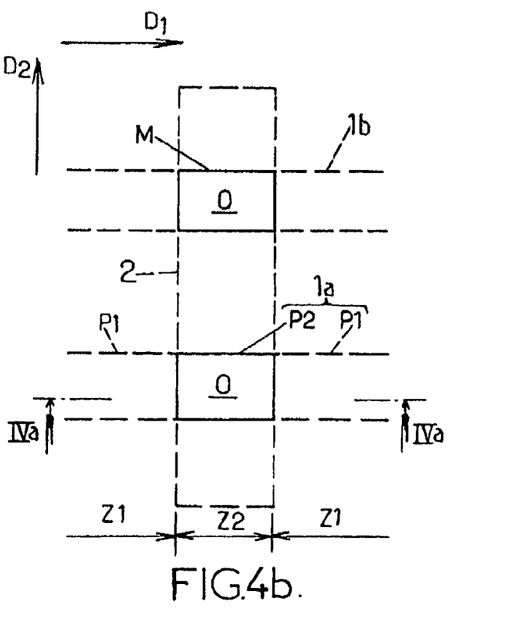

The resist layer M is developed in a known manner, for example using a dissolution bath. As the resist is a negative resist, those portions of the resist layer M that were exposed to an amount of radiation corresponding to F1 plus F2 are removed, whereas those portions of the layer M that were exposed to an amount of radiation corresponding only to the flux F1 remain. Thus, after development, the layer M has apertures O only above the track parts P2 lying in the region Z2 (FIGS. 4*a* and 4*b*). In other words, the layer M forms a mask that selectively covers the circuit outside the track parts P2. For this reason, it is called the mask M.

Figure 5A:
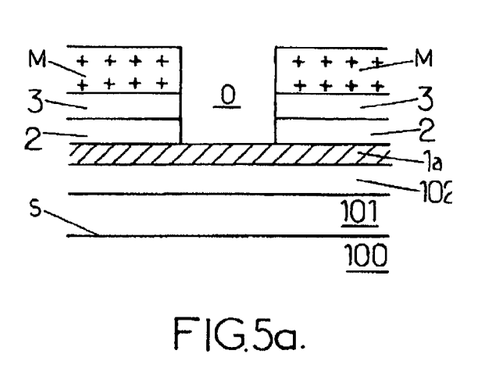

The layer 3 is then etched through the mask M using an etching plasma P directed against the upper surface of the circuit, parallel to the direction N but in the opposite sense thereto. Such an etching process is usually called dry etching. The extent of the etching, parallel to the surface S, is determined by the aperture O of the mask M. The layer 3 is thus removed on top of the track part P2, until the upper surface of the track part P2 is exposed (FIG. 5*a*).

The resist mask M is then entirely removed.

Next, a metal layer 4 is deposited on the circuit (FIGS. 6*a* and 6*b*) so as to fill the cavity formed on top of the track part P2 by the etching of the layer 3. The layer 4 may for example be based on copper, aluminum or titanium nitride. It includes a part 4*a* that extends as far as the track 1*a* in the direction N, on top of the part P2 of this track 1*a*. This part 4*a* constitutes an electrical connection, or via 4*a*, which connects the track 1*a* through the layers 2 and 3. The respective positions of the sides 11*a* and 11*b* of this via, which are parallel to the direction D2, are defined by the etching of the layer 2 illustrated by FIGS. 2*a* and 2*b*. The sides 12 and 13 of the via 4*a*, which are parallel to the direction D1, are superposed on the edges of the track 1*a* in the region Z2, given that these track edges define a boundary of the mask M for exposure to the secondary radiation flux F2. In other words, the sides 12 and 13 of the via 4*a* are aligned with the longitudinal sides of the track 1*a* along the direction N.

Figure 6A:
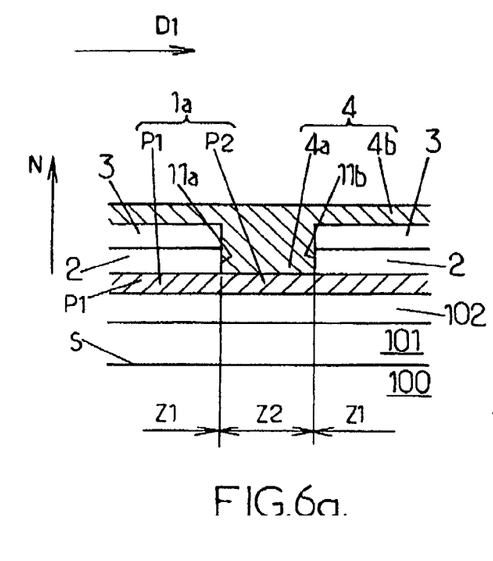
Figure 6B:
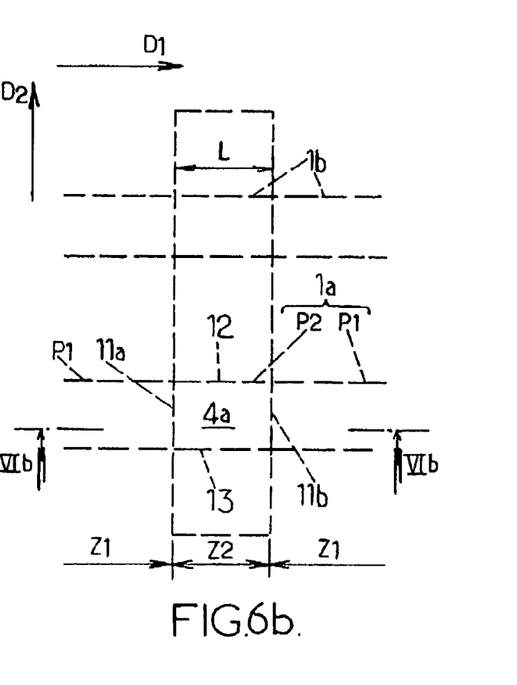

Optionally, the metal layer 4 may also include a part 4*b* that extends parallel to the surface S on the layer 3. Such a part 4*b* may constitute a track in a second metallization level of the circuit corresponding to the layers 2, 3 and 4. The track 4*b* is therefore formed at the same time as the via 4*a*.

In the first exemplary implementation of the invention that has just been described, the track part P2 corresponds to a segment of the track 1*a* of length L. This length L is defined by two opposed edges of the layer 2.

A second exemplary implementation of the invention, in which the track part P2 corresponds to one end of the track 1*a*, will now be described with reference to FIGS. 7*a*-10*b*.

Figure 7A:
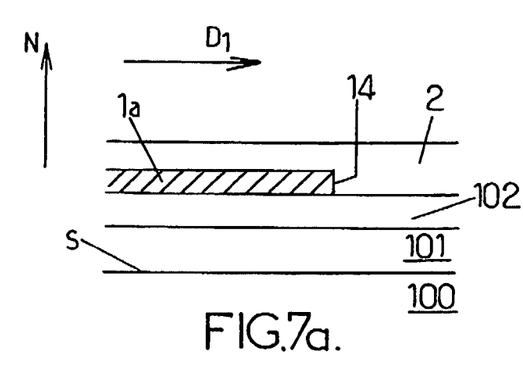
FIGS. 7a, 7b, 8a, 8b, 9a, 10a and 10b correspond to FIGS. 1a, 1b, 2a, 2b, 3a, 6a and 6b, respectively, in the case of a second way of implementing the invention.
Figure 7B:
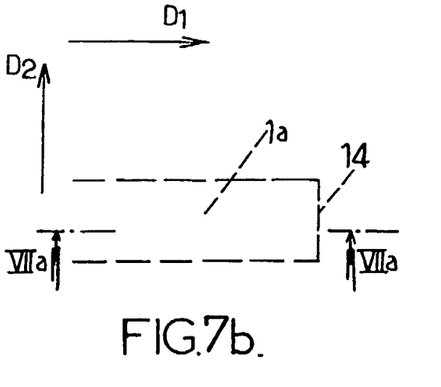

FIGS. 7*a* and 7*b* correspond to FIGS. 1*a* and 1*b*, respectively for a circuit element consisting of a track end. The track 1*a* extends over the insulating layer 102 parallel to the direction D1 and terminates in an end having a side 14 perpendicular to the direction D1.

Figure 8A:
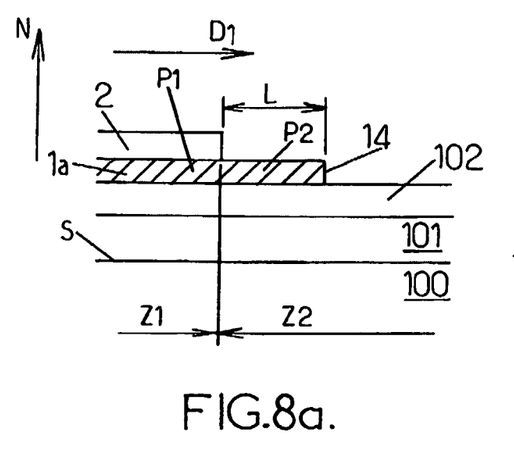
Figure 8B:
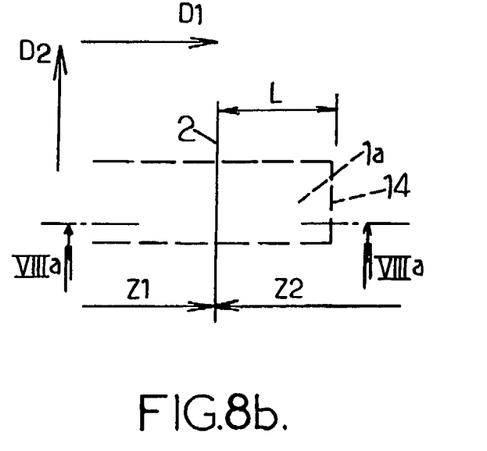

A layer 2 is again deposited on the circuit and polished on its upper surface (FIG. 7*a*). It is then etched in a region Z2 of the circuit so as to expose the track 1*a* over a length L starting from the side 14, measured parallel to the direction D1 (FIGS. 8*a* and 8*b*). The region Z2 extends beyond the side 14 in the direction D1 and, on either side of the end of the track 1*a*, in the direction D2. The track part 1*a* that remains covered by layer 2 corresponds to the part P1 of the first way of implementing the invention, and the exposed end of the track 1*a* corresponds to the part P2. The region Z1 is complementary to the region Z2 and contains the track part P1.

Figure 9A:
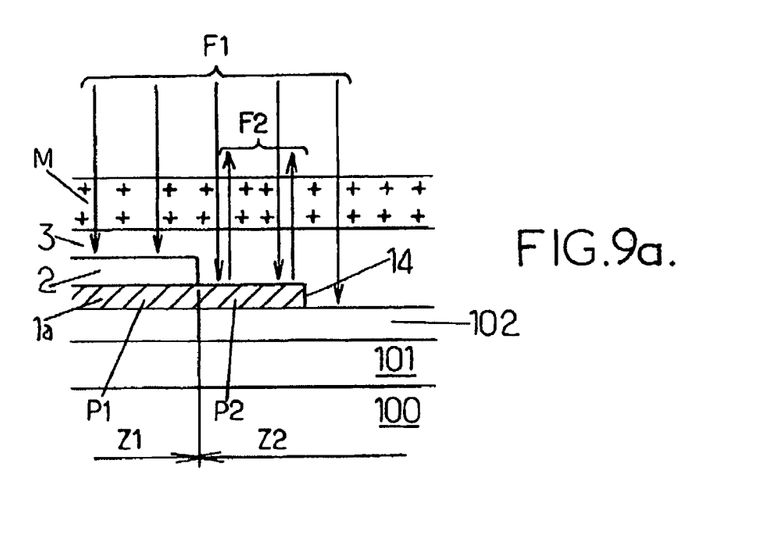

The production of the circuit is continued in an identical way to that of the first way of implementing the invention. In particular, a layer 3 is formed on the circuit and then polished to obtain an upper surface of the layer 3 that is substantially planar and parallel to the surface S of the substrate 100 (FIG. 9*a*). The materials of the layers 2 and 3 are chosen in the same way as that described above. A resist mask M is formed on the circuit and then exposed to a radiation flux F1. The intensity of the flux F1 is chosen in such a way that resist portions lying in the region Z1 are exposed to an amount of radiation below the development threshold of the resist. It is also chosen so that resist portions lying above the end P2 of the track 1*a* in the region Z2 are exposed to an amount of radiation above the development threshold of the resist, thanks to an additional radiation flux F2 produced by the flux F1 being reflected on the end P2 of the track 1A, which is not covered by layer 2.

Figure 10A:
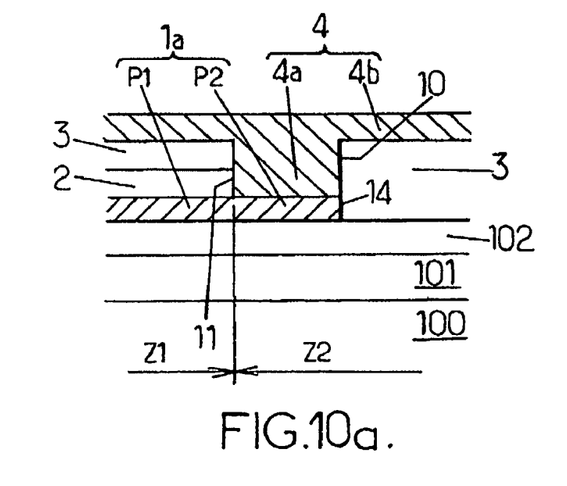
Figure 10B:
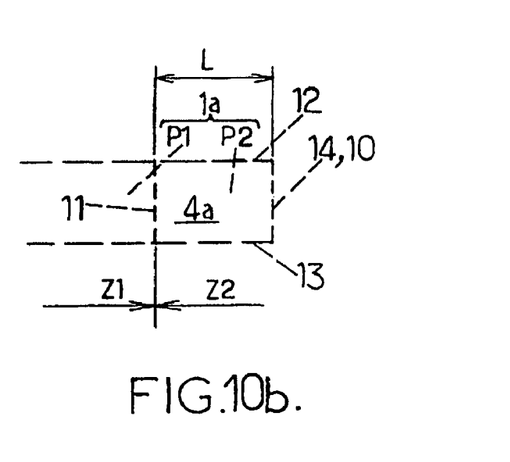

Since the resist is a negative resist, development of the mask M results in removal of the mask only from on top of the end P2 of the track 1a. The layer 3 is therefore etched only at this point, and a via 4a is obtained that has three sides 10, 12 and 13 superposed respectively on the sides of the end P2 of the track 1a. A fourth side 11 of the via 4a is defined by the edge of the layer 2, which marks the boundary between the region Z1 and Z2 (FIGS. 10a and 10b). The via 4a is therefore superposed exactly on the end P2 of the track 1a. It has a length L parallel to the direction D2 that corresponds to the distance between the edge of the layer 2 and the side 14 of the end P2 of the track 1a.

The two exemplary implementations of the invention that have just been described correspond to the formation of a via through a metallization layer of a circuit. It will be understood that the invention may be applied in an identical manner for the formation of an electrical connection through a premetallization layer of a circuit. In this case, the track 1a is replaced with a contact terminal of an electronic component of the circuit produced on the surface S. Such a terminal may for example be a gate, drain or source contact region of an MOS transistor.

Figure 11A:
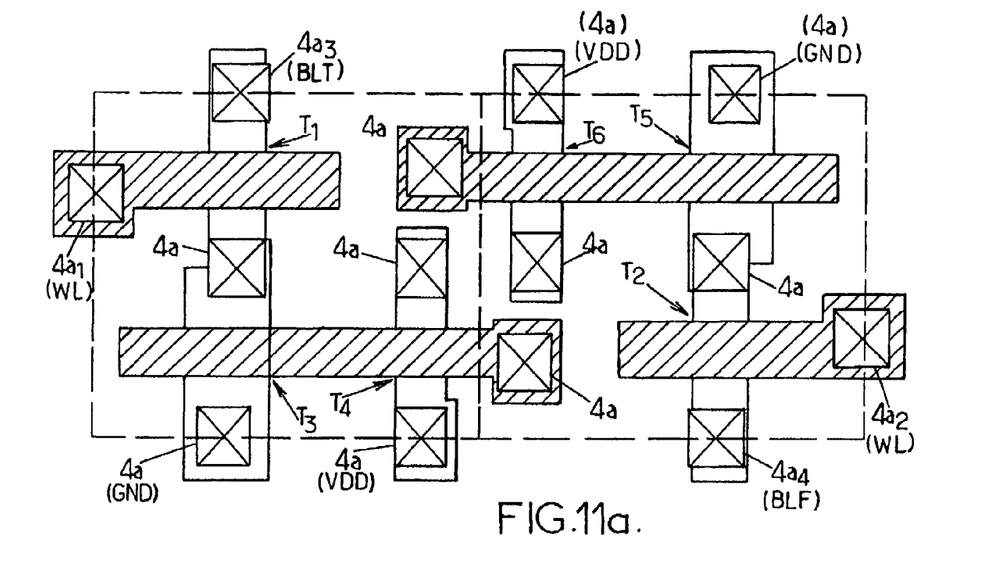
FIGS. 11a and 11b are top views of static random-access memory elements produced according to the prior art and according to the invention; respectively.
Figure 11B:
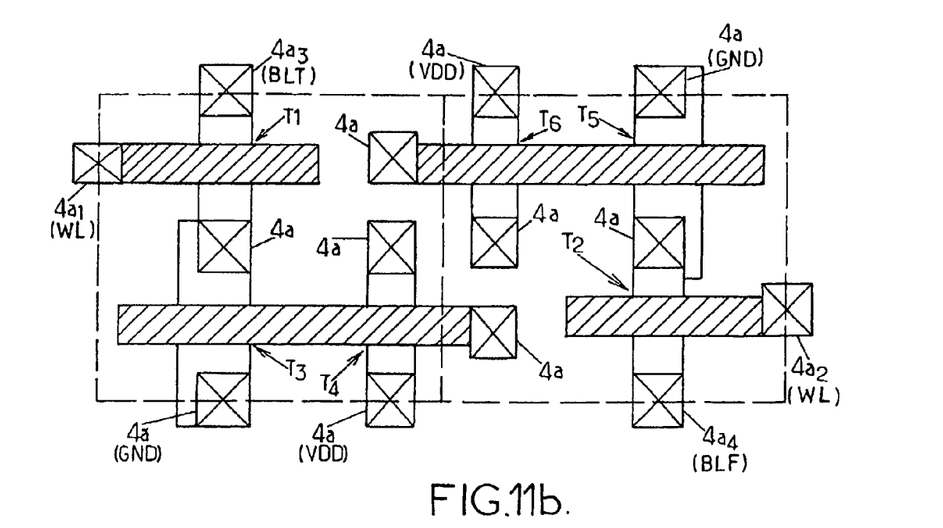

The circuit to which the invention is applied may comprise an SRAM (static random-access memory) cell comprising six MOS transistors. FIGS. 11a and 11b show configurations of such SRAM cells produced on the surface of semiconductor substrates. The example given is that of a six-transistor SRAM cell, but it will be understood that the invention may be implemented whatever the function of the circuit. The structure of an SRAM cell is known per se. It will merely be recalled that it consists of two access transistors T1 and T2 and two inverters, each consisting of two MOS transistors, respectively T3, T4 for the first inverter and T5, T6 for the second inverter of the cell. An input of each inverter is connected to an output of the other inverter (not shown in FIGS. 11a and 11b) so as to constitute a bistable system. The state of this system can be changed by switching the access transistors T1 and T2 into the on-state and simultaneously applying an appropriate electrical signal to the write terminals of the SRAM cell.

The connections $4a_1$ and $4a_2$ respectively connect gates of the access transistors T1 and T2 to a word line WL. The connections $4a_3$ and $4a_4$ respectively connect source regions of the access transistors T1 and T2 to two complementary bit lines denoted by BLT and BLF. They constitute the write terminals of the SRAM cell. Other connections of the SRAM cell, generically denoted by the reference 4a, connect source, drain or gate contact regions of the transistors of the cell together or to cell supply lines denoted by GND or VDD. The lines WL, BLT, BLF, GND and VDD are indicated in brackets after the reference numbers of the corresponding connections.

FIG. 11a shows one embodiment of a six-transistor SRAM cell as known from the prior art. Margins are needed along certain sides of the source, gate and drain contact regions of the transistors, around the connections 4a, $4a_1$-$4a_4$, in order to take into account any offsets between these connections and the transistors T1-T6. The dimensions of the cell in a plane parallel to the surface of the substrate are 1290 nm (nanometers)×540 nm in 90 nm technology for fabricating MOS transistors.

FIG. 11b corresponds to FIG. 11a for an SRAM cell of the same type, but produced using the invention. The SRAM cell of FIG. 11b is again produced using the 90 nm technology. Thanks to the invention, some of the margins of the contact regions for the transistors T1-T6 may be dispensed with, while others may be reduced. The dimensions of the SRAM cell are then 1170 nm×460 nm, which represents a saving of 23% in area of the substrate compared with the SRAM cell of FIG. 11a.

It will be understood by those skilled in the art that the invention can be implemented whatever the technology, corresponding to gate lengths of 90 nm, 65 nm, 45 nm or less, used to produce MOS transistors.

Finally, the invention may be implemented for any type of circuit element intended to be superposed on top of the surface of a substrate. Apart from a conducting track and an MOS transistor contact region, such an element may in particular be a diode, capacitor, resistor or inductor contact region or a bipolar transistor contact region.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method of producing two superposed elements within an integrated electronic circuit formed by successive levels starting from a surface of a substrate of the circuit, the method comprising the following steps:
   a) forming at least a first circuit element in a first circuit level, said first element being reflective for the radiation of a lithography process;
   b) forming a first layer above the first circuit level, in a first region of the circuit that contains a first part of the first circuit element but not in a second region of the circuit that contains a second part of said first element, said first layer being suitable for attenuating the radiation reflected by the first circuit element;
   c) forming a second layer that is substantially transparent to said radiation so as to cover the circuit at least over said second region;
   d) depositing a lithography resist mask on the circuit;
   e) exposing the resist mask to a primary radiation flux corresponding to an amount of radiation below the development threshold of the resist mask and defined so that the amount of radiation corresponding to the sum of said primary flux and of a secondary flux, obtained by reflection of said primary flux on the second part of the first circuit element, is above the development threshold of the resist mask;
   f) developing the resist mask so as to remove the portions of resist that have been exposed to the amount of radiation above the development threshold and form at least one aperture;
   g) etching the first and second layers through the at least one aperture of the developed resist mask; and
   h) depositing a portion of a defined material so as to form a second circuit element in contact with at least the second part of the first circuit element
   wherein the second circuit element has at least one first side defined by an edge of said first layer, and at least one second side superimposed with a side of said first circuit element.

2. The method according to claim 1, wherein the second region of the circuit contains several parts of first circuit elements that are formed in the first circuit level and are reflective for the radiation of the lithography process.

3. The method according to claim 1, wherein the second part of the first circuit element contains a segment of said first element, a length of said segment parallel to the substrate surface being defined by two opposed edges of the first layer.

4. The method according to claim 1, wherein the second part of the first circuit element contains one end of said first element along a direction parallel to the substrate surface, said end having a length defined by one edge of the first layer.

5. The method according to claim 1, wherein a layer that absorbs the radiation of the lithography process is deposited in one of the first circuit level around the first circuit element or between the substrate surface and the first circuit level.

6. The method according to claim 1, wherein:
the first circuit element is electrically conducting;
the second layer is electrically insulating;
the first and second layers are etched in step (g) until the second part of the first circuit element is exposed; and
the material of the second circuit element is electrically conducting so as to form an electrical connection that connects to the first circuit element.

7. The method according to claim 6, wherein the first circuit element comprises a conducting track placed in a connection level of the circuit.

8. The method according to claim 6, wherein the first circuit element comprises a contact terminal of an electronic component produced on the surface of the substrate.

9. The method according to claim 6, wherein the portion of conducting material deposited in step (h) comprises a first part extending from the first circuit element along a direction perpendicular to the substrate surface, and a second part forming a conducting track placed in a second circuit level.

10. A method, comprising:
forming a first circuit element, said first circuit element being reflective with respect to lithography radiation;
forming a first layer above the first circuit element, said first layer being attenuating with respect to lithography radiation and including a first aperture exposing at least a portion of the first circuit element;
forming a second layer above the first layer and filling the first aperture, said second layer being transparent with respect to lithography radiation;
depositing a lithography resist layer above the second layer;
exposing the lithography resist layer to a radiation flux level below a development threshold of the lithography resist layer but high enough that a sum of the radiation flux level and a secondary radiation flux level reflected from the first circuit element exceeds the development threshold of the lithography resist layer;
developing the lithography resist layer so as to obtain a mask having an opening corresponding solely to exposed portion of the first circuit element which reflected lithography radiation;
removing the first and second layers through the opening to form a second aperture; and
filling the second aperture to form a second circuit element having a first edge aligned with an edge of the first aperture and having a second edge aligned with an edge of first circuit element.

11. The method of claim 10 wherein the first circuit element is a contact terminal of an electronic component produced on a surface of a substrate, and the second circuit element comprises a level-interconnecting via.

12. The method of claim 11 wherein the second circuit element further comprises a conducting track in an overlying metallization level.

13. The method of claim 10 wherein the first circuit element is a conducting track in a first metallization level, and the second circuit element comprises a level-interconnecting via.

14. The method of claim 13 wherein the second circuit element further comprises a conducting track in a second metallization level overlying the first metallization level.

15. A method, comprising:
forming a lithography radiation attenuating layer above a first circuit element which is reflective of lithography radiation;
defining a first aperture in the lithography radiation attenuating layer which exposes at least a portion of the first circuit element;
forming a lithography radiation transparent layer above the first layer which fills the first aperture;
depositing a lithography resist layer above the lithography radiation transparent layer;
exposing the lithography resist layer to a radiation flux level below a development threshold of the lithography resist layer but high enough that a sum of the radiation flux level and a secondary radiation flux level reflected from the first circuit element exceeds the development threshold of the lithography resist layer; and
developing the lithography resist layer so as to obtain a mask having an opening corresponding solely to the exposed portion of the first circuit element which reflected lithography radiation.

16. The method of claim 15 further comprising:
removing the first and second layers through the opening to form a second aperture; and
filling the second aperture to form a second circuit element.

17. The method of claim 16 wherein the first circuit element is a contact terminal of an electronic component produced on a surface of a substrate, and the second circuit element comprises a level-interconnecting via.

18. The method of claim 16 wherein the first circuit element is a conducting track in a first metallization level, and the second circuit element comprises a level-interconnecting via.

19. The method of claim 15 wherein the opening in the mask is defined by opposed first sides aligned with corresponding opposed sides of the first aperture and wherein the opening in the mask is further defined by opposed second sides aligned with corresponding opposed edges of the first circuit element.

* * * * *